United States Patent
Chua et al.

(10) Patent No.: US 8,183,649 B2
(45) Date of Patent: May 22, 2012

(54) BURIED APERTURE NITRIDE LIGHT-EMITTING DEVICE

(75) Inventors: Christopher L. Chua, San Jose, CA (US); Zhihong Yang, Sunnyvale, CA (US)

(73) Assignee: Palo Alto Research Center Incorporated, Palo Alto, CA (US)

(*) Notice: Subject to any disclaimer, the term of this patent is extended or adjusted under 35 U.S.C. 154(b) by 28 days.

(21) Appl. No.: 12/723,544

(22) Filed: Mar. 12, 2010

(65) Prior Publication Data
US 2010/0166032 A1   Jul. 1, 2010

Related U.S. Application Data

(62) Division of application No. 11/957,799, filed on Dec. 17, 2007, now Pat. No. 7,718,455.

(51) Int. Cl.
*H01L 27/14* (2006.01)
*H01L 29/82* (2006.01)
*H01L 29/84* (2006.01)

(52) U.S. Cl. ........ 257/414; 372/45.01; 372/46; 372/414
(58) Field of Classification Search ............... 372/45.01, 372/46, 96; 257/414
See application file for complete search history.

(56) References Cited

U.S. PATENT DOCUMENTS

| | | | |
|---|---|---|---|
| 6,233,267 B1* | 5/2001 | Nurmikko et al. | 372/46.014 |
| 6,285,696 B1 | 9/2001 | Bour et al. | |
| 6,288,417 B1 | 9/2001 | Nickel et al. | |
| 6,455,340 B1 | 9/2002 | Chua et al. | |
| 6,590,919 B1 | 7/2003 | Ueta et al. | |
| 7,160,749 B2 | 1/2007 | Chua | |
| 2007/0120206 A1* | 5/2007 | Song et al. | 257/414 |

OTHER PUBLICATIONS

Zhou et al., "Simplified-antiresonant reflecting optical waveguide-type vertical-cavity surface-emitting lasers", Appl. Phys. Lett. v.76, No. 13, pp. 1659-1661 (2000).

* cited by examiner

*Primary Examiner* — William M. Brewster
(74) *Attorney, Agent, or Firm* — Jonathan A. Small

(57) ABSTRACT

A buried aperture in a nitride light emitting device is described. The aperture is formed in an aperture layer, typically an amorphous or polycrystalline material over an active layer that includes a nitride material. The aperture layer material typically also includes nitride. The aperture layer is etched to create an aperture which is filled with a conducting material by epitaxial regrowth. The amorphous layer is crystallized forming an electrically resistive material during or before regrowth. The conducting aperture in the electrically resistive material is well suited for directing current into a light emitting region of the active layer.

13 Claims, 7 Drawing Sheets

BURIED APERTURE NITRIDE LIGHT-EMITTING DEVICE

CROSS-REFERENCE TO RELATED APPLICATIONS

The present application is a divisional application of U.S. Application for Letters patent Ser. No. 11/957,799, filed on Dec. 17, 2007, now U.S. Pat. No. 7,718,455, which, in its entirety, is hereby incorporated herein by reference and to which priority is claimed.

BACKGROUND

GaAs and InP optoelectronic devices, including vertical cavity surface-emitting lasers (VCSELs) and high performance diodes, often use a more electrically conducting "aperture" in a nonconducting layer to direct electrical current into a central light-emitting region or "active" region. In most of these GaAs and InP systems, aperture materials are also selected to have a higher refractive index than the nonconducting layer material, thereby enabling the aperture to also confine the generated optical fields. See U.S. Pat. No. 7,160,749 entitled "Method and Structure for Eliminating Polarization Instability in Laterally Oxidized VCSELs" by Chua et al. which is hereby incorporated by reference in its entirety. In some "anti-resonant" structures, the refractive index of the aperture is designed to have a lower value than surrounding areas to controllably induce losses to higher order modes.

Various methods are available for forming the conducting aperture. In one method, a chemical etch to form a pattern followed by a regrowth of the aperture material in the patterned layer openings is used to form the aperture. Such a procedure is described in D. Zhou and L. J. Mawst, Appl. Phys. Lett., v.76 (13), 2000, pp. 1659-1661 which is hereby incorporated by reference. Alternate methods of forming a conducting aperture in an AlGaAs layer include converting select non-aperture regions of the AlGaAs layer into an insulating oxide through selective wet thermal oxidation. The oxidized material also has a lower refractive index than the unoxidized material.

Although conducting apertures and/or light guiding apertures would benefit an indium aluminum gallium nitride (InAlGaN) light emitting device, a suitable means for forming such apertures has not been available. Chemical etching of nitride heterostructures followed by subsequent regrowth in patterned layer openings has proved difficult because InAlGaN crystalline alloys are very stable and are therefore resistant to chemical attack. Oxidation techniques have also been difficult to implement because nitride based materials are not easily oxidized.

Thus a method of forming apertures that channel current and/or confine optically generated fields in a nitride based light emitting structure is needed.

SUMMARY

A method of forming a current directing aperture in a nitride optoelectronic device is described. In the method, an aperture layer including nitride is deposited over a crystalline active layer that also includes nitride. The deposition typically forms an amorphous or polycrystalline aperture layer. The deposition of the aperture layer occurs at a low temperature below 800 degrees centigrade. Apertures are etched into the aperture layer. Subsequently, a crystalline heterostructure layer that also includes nitride is regrown over the aperture layer, the crystalline heterostructure layer to produce a buried aperture that can be used to direct light or current.

DETAILED DESCRIPTION

A structure including conducting apertures to channel current and/or confine optically generated fields in a nitride light emitting device and a method of forming the structure is described. The method involves forming and subsequently etching openings into a thin amorphous InAlGaN layer, after which the InAlGaN layer is crystallized.

Figure 1:
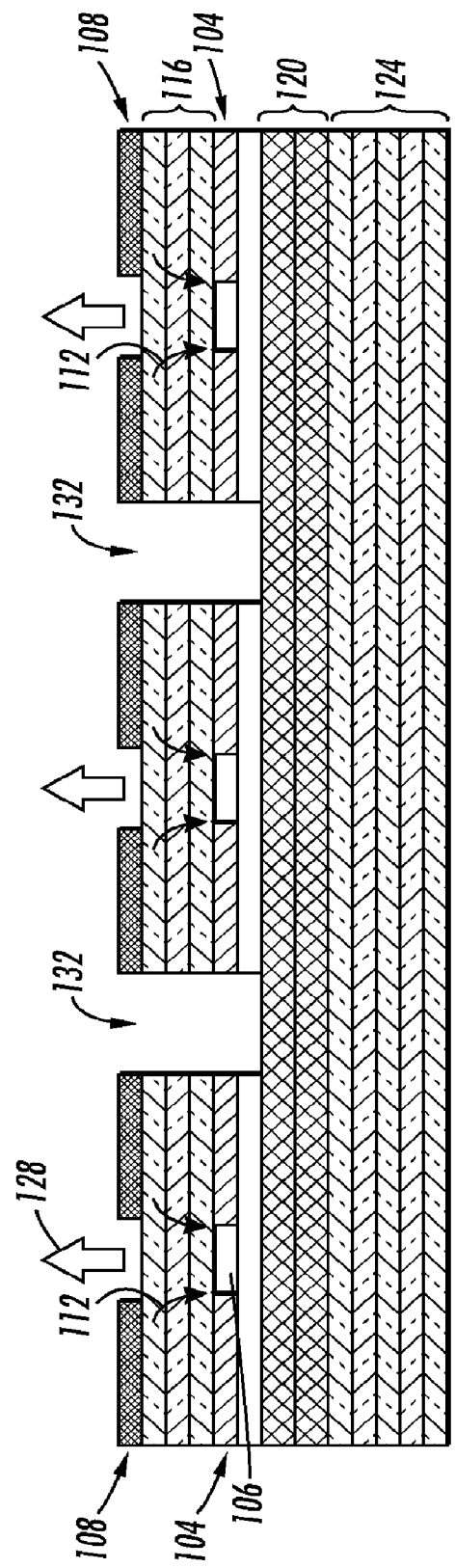
FIG. 1 shows a VCSEL array incorporating buried apertures.

FIG. 1 shows a VCSEL array incorporating buried apertures 106 in an aperture layer 104. Electrodes 108 provide current 112 that flow through top mirror layer 116. Apertures 106 direct current into active regions of active region layer 120. The current generates light in the active region. Top mirror layer 116 and bottom mirror layer 124 together form a laser cavity. Typically, the top mirror layer and the bottom mirror layer are distributed Bragg reflectors (DBRs) that confine light in the active region to build up stimulated emissions. Emitted light 128 is output through apertures 106. As used herein, the term "apertures" refers to an "opening" that may or may not be filled with a material. However, when filled the characteristics of the aperture material is such that the electrical conductivity is lower than the surrounding material and/or the optical transmissivity is lower than the surrounding material.

In a traditional GaAs optoelectronic light outputting device, the aperture may be formed by selective wet thermal oxidation of an AlGaAs aperture layer similar to the aperture layer 104. In one fabrication technique, an oxidizing agent enters gaps 132 between adjacent VCSELs in the VCSEL array. The oxidizing agent gradually oxidizes aperture layer 104 from the gap 132 perimeter towards the areas that will form apertures 106. Oxidation is terminated before the region to form apertures 106 is oxidized. When aperture layer 104 is AlGaAs, an oxidized AlGaAs bordering an unoxidized AlGaAs aperture results. The aperture's unoxidized AlGaAs has a higher refractive index then the surrounding oxidized AlGaAs thereby providing optical guiding of emitted light. The oxidized AlGaAs also has a lower electrical resistivity than the surrounding AlGaAs thereby directing current through the aperture and the device active region. The described procedure for forming an aperture in an AlGaAs layer is described in U.S. Pat. No. 7,160,749 by Chua et al. which is hereby incorporated by reference.

In the present invention, the VCSEL structure shown in FIG. 1 as well as analogous light emitting structures may be fabricated with an InAlGaN aperture layer. In such a device, the InAlGaN aperture layer corresponds to aperture layer 104. FIGS. 2-5 show examples of the steps used to form such a structure.

Figure 2:
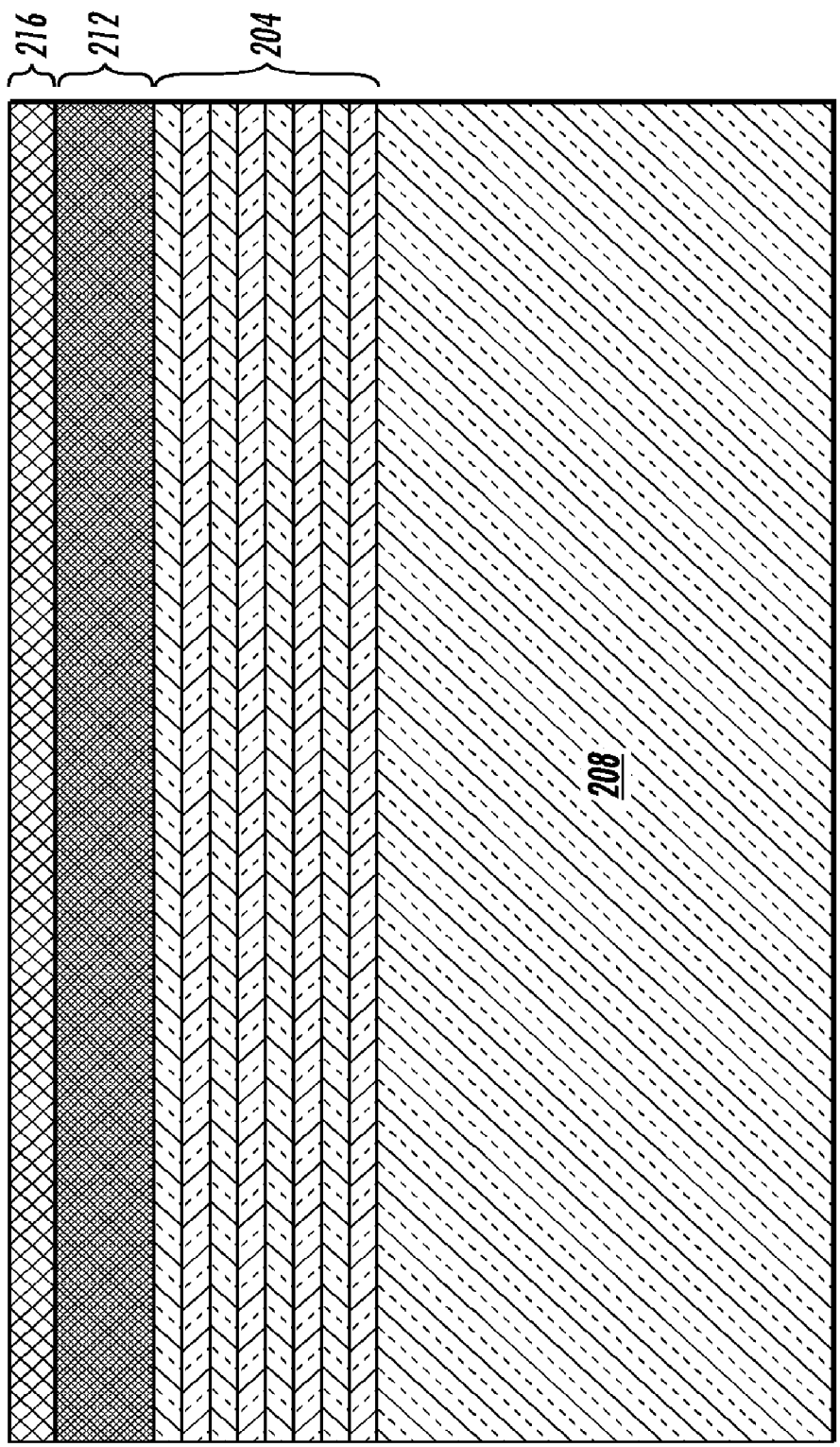
FIG. 2 shows an intermediate structure used in forming a light emitting optoelectronic device, the intermediate structure including a low temperature amorphous aperture layer deposited over a nitride active layer.

FIG. 2 shows an AlGaN DBR mirror layer 204 formed over a sapphire heterostructure substrate 208. DBR mirror layers are commonly employed in resonant cavity devices such as lasers. AlGaN DBR mirrors are typically fabricated using alternating pairs of $Al_pGa_{1-p}N/Al_qGa_{1-q}N$ layers. Mirror layer growth is controlled such that alternating tensile and compressive strains achieve a high index of refraction contrast between alternating layers to produce a highly reflective structure at the wavelength of light produced by the active region. Such mirror formation is described in various references including U.S. Pat. No. 6,775,314 which is hereby incorporated by reference.

An InAlGaN active layer 212 is grown, usually epitaxially using MOCVD, over mirror layer 204. The amount of In and Al relative to Ga is chosen based on the design of the specific structure and on the desired emission wavelength. Such growth techniques are described in U.S. Pat. No. 6,285,696 by Bour et al entitled "AlGAInN Pendeoepitaxy LED and Laser Diode Structures for Pure Blue or Green Emission" which is hereby incorporated by reference. After active layer 212 formation, an amorphous aperture layer 216 is deposited at low temperatures, typically around 550 degrees Centigrade, (although the temperatures typically range from 400 to 800 degrees centigrade) over active layer 212. A lower approximate limit of 400 degrees occurs because below that temperature, it becomes difficult to crack ammonia which is often used as a nitrogen source for nitride films. However, using a catalyst or other methods to crack ammonia at a lower temperature, or using a different source of nitrogen altogether can enable deposition of nitride films at much lower temperatures, including room temperature. Above approximately 800 degrees centigrade, the amorphous material usually crystallizes. Typically the amorphous aperture layer is AlN, although GaN and other alloys of $In_aAl_bGa_{1-a-b}N$ may also be used. The aperture layer material is preferably a nitride material that may be deposited at low temperatures in amorphous form and subsequently crystallized over the active layer 212.

Amorphous aperture layer 216 is usually thin, typically between 5 and 100 nm thick with an example thickness on the order of 20 nm. Keeping the amorphous aperture layer thin prevents cracking during subsequent growths. The heterostructure underlying the amorphous aperture layer is typically a crystalline $In_xAl_yGa_{1-x-y}N$ layer grown at temperatures ranging from 700 degrees to 1200 degrees centigrade where x and y ranges between 0 and 1 depending on the desired device characteristics.

After thin amorphous aperture layer 216 formation, the wafer is cooled, typically to a temperature below 100 degrees centigrade, more typically to room temperature and removed from the growth reactor for subsequent patterning and etching. Standard photolithographic techniques may be used to pattern the aperture layer 216. In particular, the aperture layer may be coated with a photoresist, masked and exposed to UV radiation that crosslinks unmasked regions of the photoresist. The unmasked regions of the photoresist are removed creating openings in the photoresist. The patterned openings allow an etchant to etch corresponding apertures into the amorphous aperture layer.

Although most of the specification describes a MOCVD-grown amorphous aperture layer 216, in an alternate embodiment, the aperture layer can also be deposited by physical vapor deposition (PVD). In the case of PVD, the deposition temperature can be much lower, and the layer can be deposited in polycrystalline form. As in the case of an amorphous aperture layer, and unlike a single crystal aperture layer, the polycrystalline aperture layer can be patterned and etched as described to form the apertures followed by a subsequent regrowth of material. As used herein, "single crystal" aperture layer means an aperture layer where the crystal lattice order of the aperture layer is unbroken over an extended area. "Non-single crystalline material" as used herein is broadly defined to include any material that is not a single crystal, including amorphous materials and poly-crystalline materials.

Figure 3:
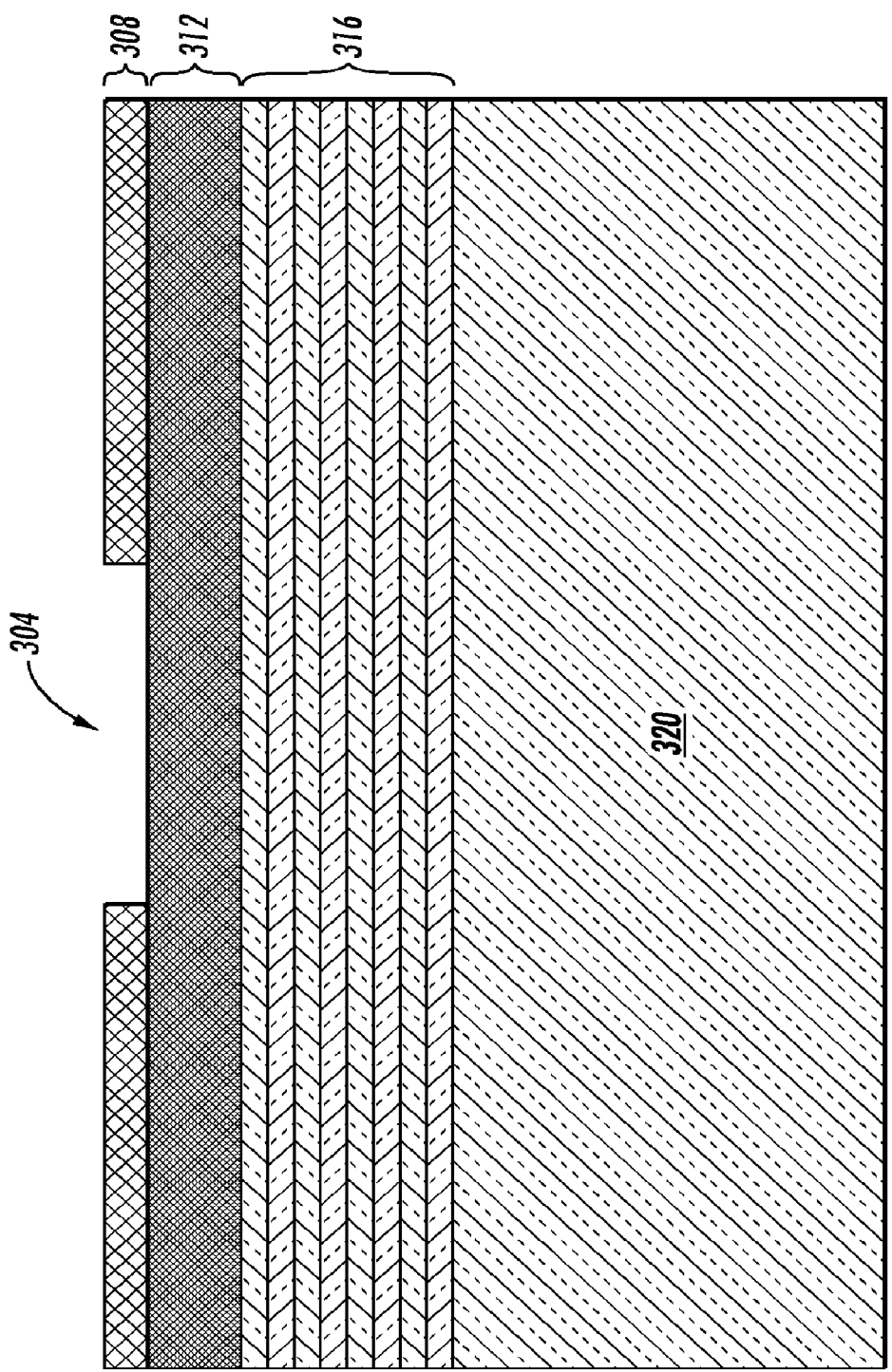
FIG. 3 shows a side cross sectional view of an intermediate structure that used in fabricating a VCSEL, the intermediate structure including an aperture etched into an aperture layer.
Figure 4:
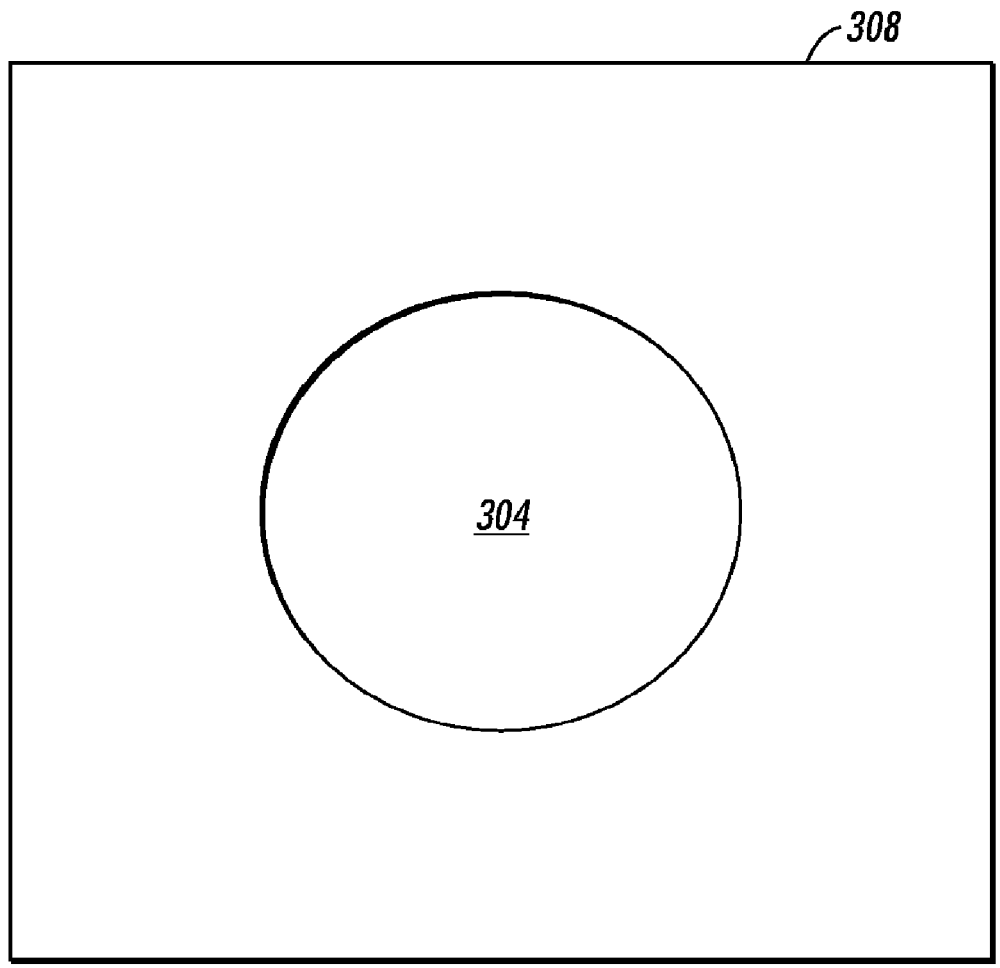
FIG. 4 shows a top view of one embodiment of an aperture layer.

FIG. 3 shows a side view and FIG. 4 shows a top view of an example aperture 304 formed in amorphous aperture layer 308. Although FIG. 4 shows a circular aperture opening, the aperture opening may be a variety of shapes including but not limited to rectangular and triangular shapes. The aperture shape and area can define the active region and light guiding properties of the aperture, thus the aperture may determine the beam profile output from the optoelectronic device. Typically, aperture areas range between 4 and 40,000 $\mu m^2$.

Various method may be used to form or etch the aperture opening. One method of forming the aperture opening uses chemicals such as phosphoric acid to wet etch an amorphous AlN aperture layer. Because the chemicals do not attack crystalline nitride structures, the underlying crystalline nitride layer 304 forms a natural etch stop. In one embodiment, the crystalline nitride layer 312 that forms the etch stop is the active layer (light emitting layer) of the optoelectronic device (such as active layer 212). Although wet chemical etching offers improved selectivity and reduced contamination potential, dry etching techniques may also be used to create aperture 304.

Figure 5:
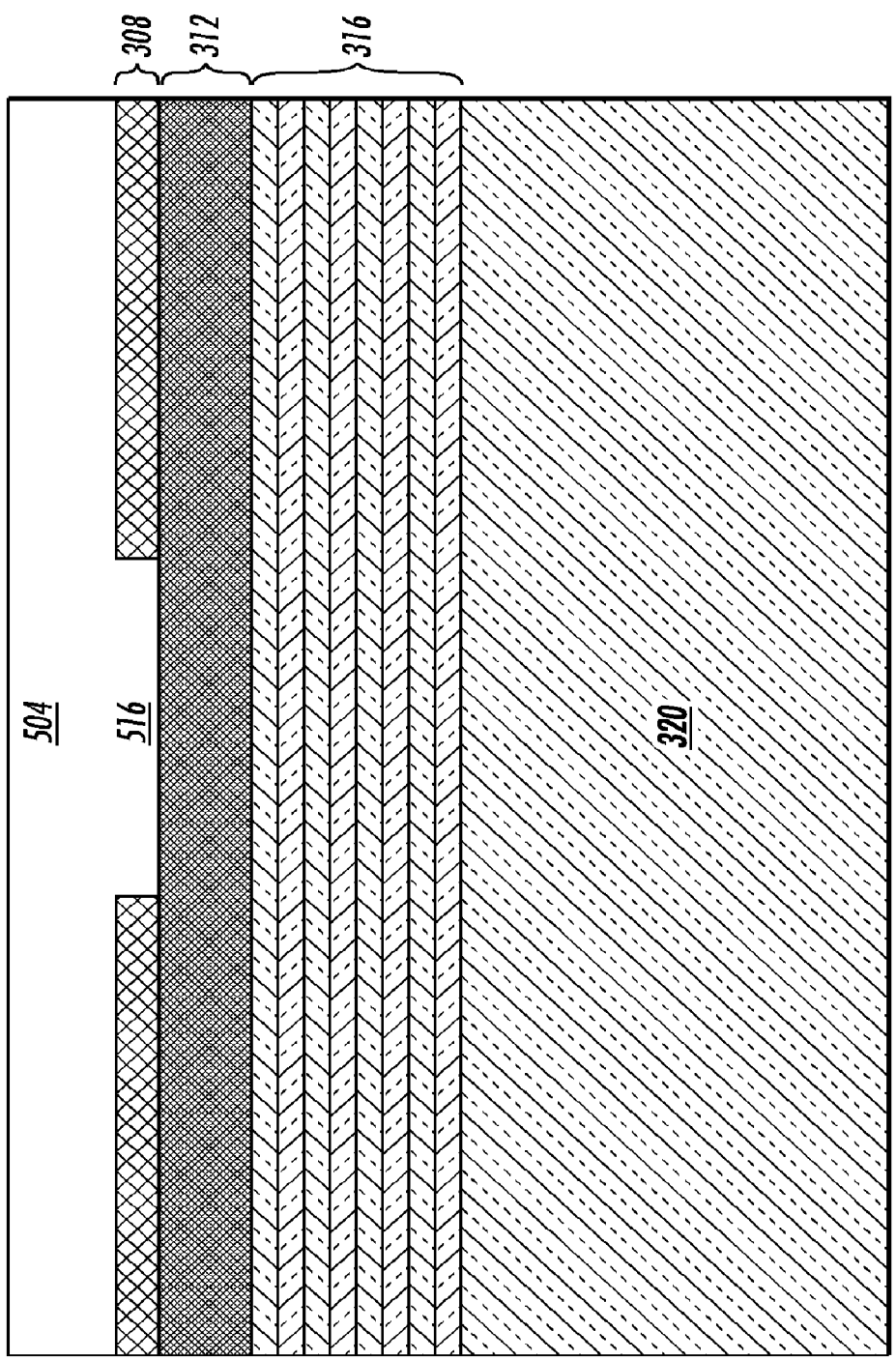
FIG. 5 shows a side cross sectional view of a crystalline heterostructure that has been regrown over a patterned aperture layer.

After etching, FIG. 5 shows additional InAlGaN heterostructure layers 504 regrown on the patterned surface. Regrowth typically occurs in a MOCVD reactor. The high temperatures, typically between 700 and 1200 degrees centigrade, used in regrowing InAlGaN layers 504 is typically sufficient to automatically crystallize an AlN amorphous aperture layer. Complete crystallizing the amorphous aperture layer is not necessary. However, crystallizing the amorphous aperture layer at least in part after patterning ensures growth of high quality films throughout the wafer area, not just at the aperture region, during subsequent growths. Crystallization of the amorphous aperture layer can typically be accomplished in-situ during the regrowth process. However, when the temperature is insufficient to crystallize amorphous aperture layer 308 materials, an anneal step with a temperature of over a thousand degrees (typically around 1025 degrees centigrade) may be included in the MOCVD growth recipe prior to flowing metal organics. A similar technique for growing a high quality nitride heterostructure on a sapphire substrate using low temperature AlN nucleation layers that are annealed prior to growing additional InAlGaN epitaxial layers is described in U.S. Pat. No. 6,537,513 entitled "Semiconductor Substrate and Method for Making the Same" by Amano et al. which is hereby incorporated by reference in its entirety.

Regrowth layers 504 which include the material filling aperture region 516 are typically epitaxially grown and doped p-type to make the regrown layers electrically conductive. The now at least partially crystalline material of aperture material layer 308 (typically AlN) surrounding the aperture is electrically resistive. Thus filled aperture region 516 serves as an aperture that funnels injected current into an active region in active layer 312. Because in one embodiment, AlN has a higher refractive index than the surrounding InAlGaN material filling aperture region 516, the aperture also guides and confines generated light within the aperture region. In one embodiment, the regrown InAlGaN heterostructure layer 504 also serves as a current spreading layer that spreads current from a current source, typically metal contacts formed over heterostructure layer 504.

Figure 6:
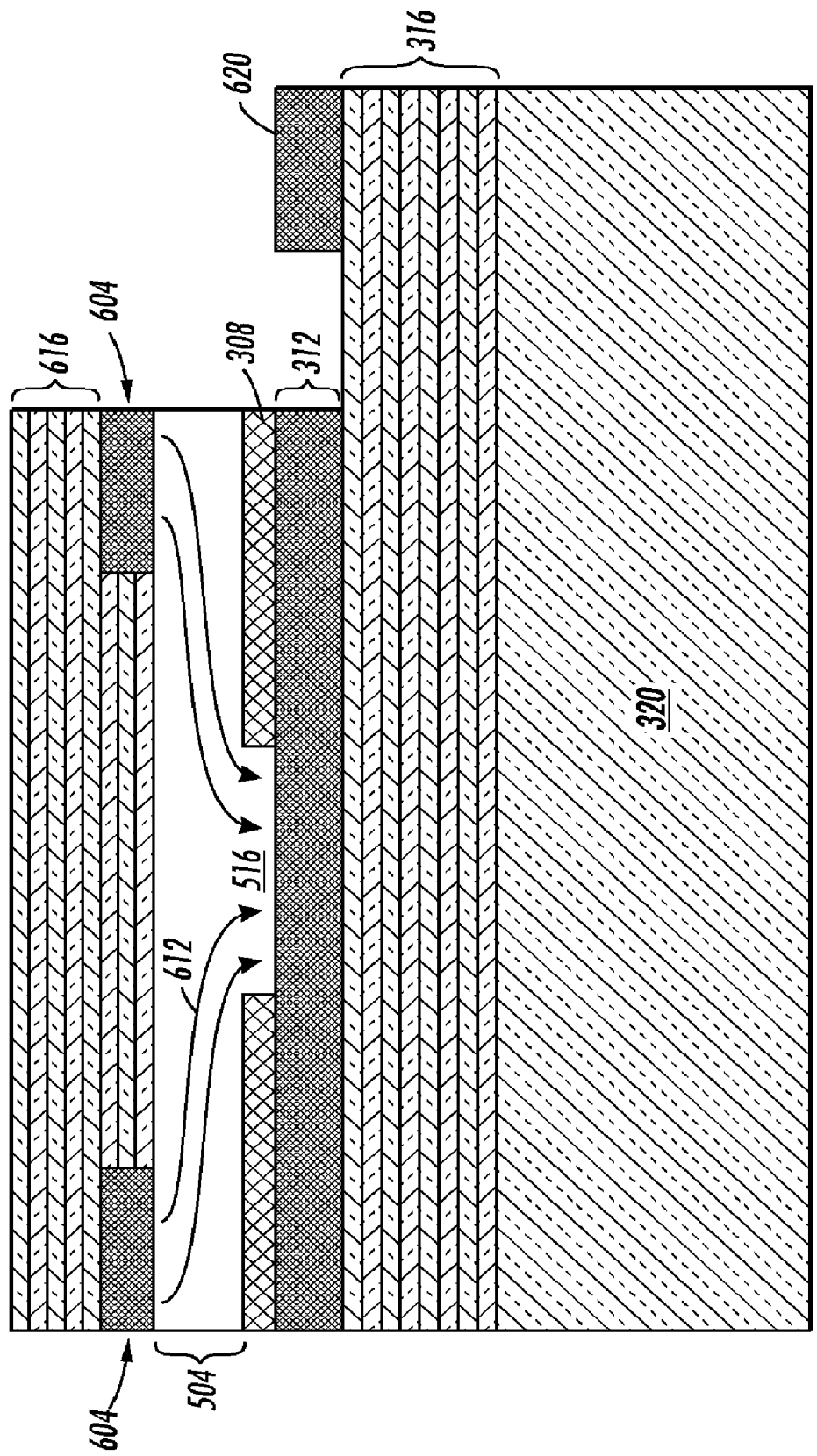
FIG. 6 shows a side cross sectional view of one embodiment of a VCSEL with a buried aperture.
Figure 7:
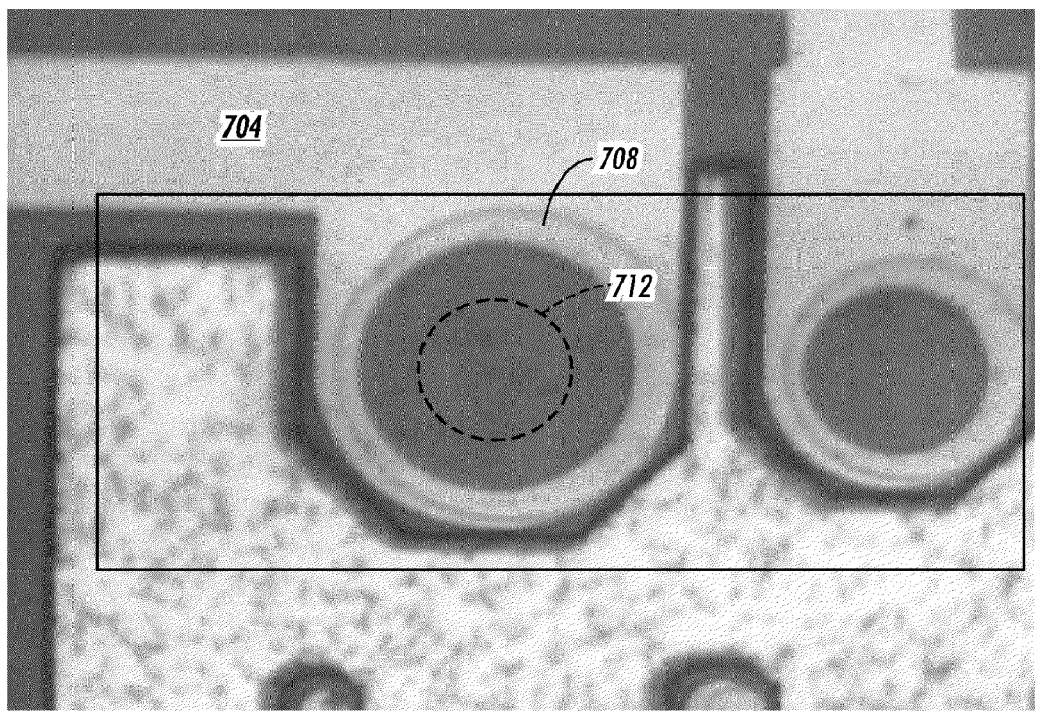
FIG. 7 shows a top view of a nitride VCSEL with a buried aperture.

FIG. 6 shows a cross sectional view and FIG. 7 shows a top view of one embodiment of using the structure of FIG. 5 in a resonant cavity light-emitting device. In FIG. 6, a metal contact 604 is formed over current spreading layer 504. In the illustrated embodiment, metal contact 604 is an annular p-metal contact that provides electrical current 612. Aperture region 516 channels current 612 into the nitride containing active regions of active layer 312 where electrons and holes recombine to generate emitted photons. The current travels through mirror layer 316 to an n contact. In the embodiment shown in FIG. 6, the p and n contacts are formed on the same side of the wafer. This may be done by etching mesas and forming one electrode, typically the p-contact 604 in an upper portion of the mesa and another electrode, typically the n-contact 620 laterally adjacent to a bottom portion of the mesa as shown. In an alternate embodiment, the n contact may be formed between the mirror layer 316 and the sapphire substrate 320 using a laser lift off process as described in U.S. Pat. No. 6,455,340 entitled "Method Of Fabricating GaN Semiconductor Structures Using Laser-Assisted Epitaxial Lift-Off" by Chua et al. and hereby incorporated by reference.

In FIG. 6, a top set of mirrors 616 are formed over the current spreading layer (also called regrowth layer) 504 and the metal contact 604. In one embodiment, the top mirror set are alternating layers of quarter wave thick distributed Bragg reflectors which may be formed using dielectric materials deposited by electron beam evaporation. An example material for forming mirror layer 616 includes silicon oxide. Upper mirror layer 616 and lower mirror layer 316 together form a Fabry-Perot cavity for a resonant cavity light-emitting diode. If the reflectivity of the mirrors is sufficiently high, the device can operate as a vertical-cavity surface-emitting laser (VCSEL). The cavity enhances light emission at the resonant mode.

FIG. 7 shows a top view of the example light emitting device. FIG. 7 shows a p-metal routing wire 704 that connects a p metal contact 708 to a source of electrical current (not shown). An insulating passivation layer such as $SiO_2$ or $Si_3N_4$ separates the wire from the wafer surface.

Current flows along the routing wire to the p metal contact. The current spreading layer distributes electrical current laterally from the annular metal contact to the central aperture region in the aperture layer. Each aperture, such as buried aperture 712, directs current into an active region of the active layer where the current exits the device via a second contact. Dielectric DBR mirrors may be evaporated over a large area to cover many devices at once. The final resulting devices may emit light from a top surface or from a bottom surface depending on the intended application. Bottom emitting devices provide for relatively simple fabrication because it is easier to form a highly reflective e-beam evaporated top dielectric mirror than a highly reflective MOCVD grown bottom epitaxial mirror. When sufficient low optical losses are achieved, the resonant cavity device performs as a vertical cavity surface-emitting laser.

The preceding description includes a number of details that are provided to facilitate understanding of the invention, and should not be interpreted to thus limit the invention. Instead, the scope of the invention should be defined by the claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. A vertical surface-emitting optoelectronic device including a buried current-directing aperture, comprising:
    an active layer including an active region for emitting light, the active region including a nitride;
    an electrically resistive aperture layer formed over the active region, the electrically resistive layer defining an aperture therein, at least a portion of the electrically resistive layer comprising amorphous aluminum nitride disposed over said active layer and at least a portion of the electrically resistive layer comprising crystallized aluminum nitride disposed over said amorphous aluminum nitride; and,
    a second crystalline layer that includes nitride formed over said resistive aperture layer, the second crystalline layer doped to be electrically conductive, at least a portion of the second crystalline layer filling in the aperture in the electrically resistive layer, the second crystalline layer in combination with the electrically resistive aperture layer to direct current into a select active region in the active layer to generate light.

2. The optoelectronic device of claim 1, further comprising a first distributed Bragg mirror structure formed between the active region and a substrate on which the optoelectronic device is formed, and a second distributed Bragg mirror structure formed over the second layer opposite the electrically resistive aperture layer, such that the active region, aperture, and at least a portion of the second layer are disposed between the first and second distributed Bragg mirror structures, and further such that the optoelectronic device thereby forms a resonant-cavity light-emitting device.

3. The optoelectronic device of claim 1, wherein the active region and the second layer are both formed from InAlGaN.

4. The optoelectronic device of claim 1, further comprising an electrical contact formed over the second layer, the electrical contact to provide a current, the aperture in the electrically resistive layer directing the current to the active region where light is emitted.

5. The optoelectronic device of claim 1, wherein the index of refraction of the electrically resistive layer is lower than the index of refraction of the aperture.

6. The optoelectronic device of claim 1, wherein the resistive aperture layer is formed directly over the active region.

7. An optoelectronic device to emit light, the optoelectronic device comprising:
    a sapphire substrate;
    an active layer including a nitride material formed over the sapphire substrate, said active layer including an active region;
    an electrically resistive aperture layer formed over the active region, the electrically resistive aperture layer defining an aperture therein, at least a portion of the electrically resistive layer comprising amorphous aluminum nitride disposed over said active layer and at least a portion of the electrically resistive layer comprising crystallized aluminum nitride disposed over said amorphous aluminum nitride; and
    a conducting material layer formed over said electrically resistive aperture layer, a portion of the conducting material layer filling the aperture, such that current is directed from the aperture into the active region to thereby cause light generation.

8. The optoelectronic device of claim 7, further comprising a first distributed Bragg mirror structure formed on one side of the active region and a second distributed Bragg mirror structure formed on one side of the conducting material layer, such that the electrically resistive aperture layer is disposed between and in physical contact with the first and second distributed Bragg mirror structures, and further such that the optoelectronic device thereby forms a resonant-cavity light-emitting device.

9. The optoelectronic device of claim 7, wherein the active region and the conducting material layer are both formed from InAlGaN.

10. The optoelectronic device of claim 7, further comprising an electrical contact formed over the conducting material layer, the electrical contact to provide a current, the aperture in the electrically resistive aperture layer directing the current to the active region where light is emitted.

11. The optoelectronic device of claim 7, wherein the index of refraction of the electrically resistive aperture layer is lower than the index of refraction of the aperture.

12. The optoelectronic device of claim 7, wherein the electrically resistive aperture layer is formed directly over the active region.

13. A vertical surface-emitting optoelectronic device including a buried current-directing aperture, comprising:

a sapphire substrate;

a first distributed Bragg mirror structure formed over said sapphire substrate;

an indium aluminum gallium nitride (InAlGaN) active layer formed over the first distributed Bragg mirror structure, the active layer including an active region for emitting light;

an electrically resistive aperture layer formed over the active region, the aperture layer having a first resistivity and a first index of refraction, the aperture layer defining an aperture therein directly over the active region, at least a portion of the electrically resistive aperture layer comprising amorphous aluminum nitride (AlN) disposed over said active layer and at least a portion of the electrically resistive layer comprising crystallized aluminum nitride (AlN) disposed over said amorphous aluminum nitride (AlN);

an indium aluminum gallium nitride (InAlGaN) crystalline upper layer formed over said electrically resistive aperture layer, the crystalline upper layer doped to be electrically conductive such that the upper layer has a second resistivity that is substantially lower than the first resistivity, at least a portion of the crystalline upper layer filling in the aperture in the electrically resistive aperture layer such that the filled in aperture has a second index of refraction lower than the first index of refraction, the upper layer material in the aperture together with the electrically resistive aperture layer acting together to both direct current into the active region to generate light and to confine light generated thereby; and a second distributed Bragg mirror structure formed over the crystalline upper layer to thereby form a resonant-cavity light-emitting device.

* * * * *